(12) United States Patent
Ito et al.

(10) Patent No.: US 6,348,787 B1
(45) Date of Patent: Feb. 19, 2002

(54) ELECTROOPTIC PROBE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/408,753

(22) Filed: Sep. 30, 1999

(30) Foreign Application Priority Data

Sep. 30, 1998 (JP) ............................................ 10-294567

(51) Int. Cl.$^7$ ............................................. G01R 31/00
(52) U.S. Cl. ....................................................... 324/96
(58) Field of Search ........................... 324/96, 750, 751, 324/752; 359/245

(56) References Cited

U.S. PATENT DOCUMENTS

| | | | |
|---|---|---|---|
| 4,920,310 A | * | 4/1990 | Aoshima et al. .............. 324/96 |
| 4,982,151 A | * | 1/1991 | Takahashi et al. ............ 324/96 |
| 5,105,148 A | | 4/1992 | Lee |

FOREIGN PATENT DOCUMENTS

| | | |
|---|---|---|
| DE | 4216261 | 11/1993 |
| EP | 0645635 | 3/1995 |
| WO | WO 8909413 | 10/1989 |
| WO | WO 9600905 | 1/1996 |

* cited by examiner

Primary Examiner—Vinh P. Nguyen
(74) Attorney, Agent, or Firm—Blakely Sokoloff Taylor & Zafman

(57) ABSTRACT

A probe for an electrooptic sampling oscilloscope in which an electric field generated by a measured field is coupled with an electrooptic crystal. A beam is incident on this electrooptic crystal, and by the polarization state of the incident beam, the form of the measured signal is measured. The electrooptic element is supported form the end terminal side of the probe body by a probe head member that serves as the end terminal of the probe body. An insertion hole is formed from the outside up to the reflecting film on the probe head member. One end thereof is in contact with a reflecting film, the other end thereof is inserted so as to protrude from the probe head member, and at the same time, the external radial diameter of the insertion hole is formed so as to be large compared to the radial dimension of the reflected film.

16 Claims, 5 Drawing Sheets

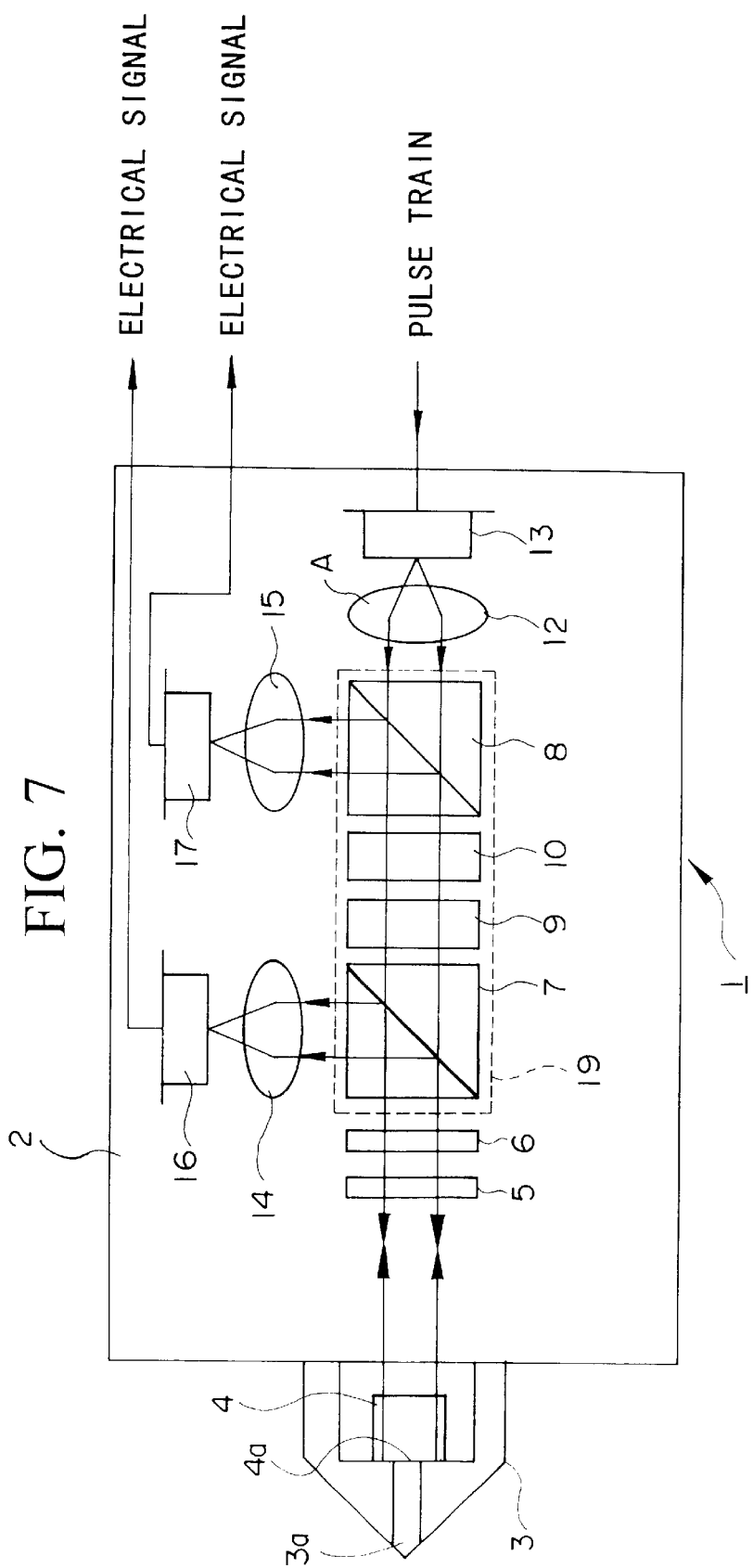

ELECTROOPTIC PROBE

BACKGROUND OF THE INVENTION

1. Field of the Invention

The present invention relates to a probe for an electrooptic sampling oscilloscope that couples an electrical field generated by a measured signal and an electrooptic crystal, inputs a beam into this electrooptic crystal, and measures the waveform of the measured light signal by the state of the polarization of the input light.

This application is based on Japanese Patent Application, No. Hei 10-294567 filed in Japan, the content of which is incorporated herein by reference.

2. Description of the Related Art

It is possible to couple an electrical field generated by a measured signal with an electrooptic crystal, input a laser beam into this electrooptic crystal, and observe the waveform of the measured signal by the state of the polarization of the laser beam. It is possible pulse the laser beam, and observe with an extremely high time resolution when sampling the measured signal. The electrooptic sampling oscilloscope uses an electrooptic probe exploiting this phenomenon.

When this electrooptic sampling oscilloscope (hereinbelow, referred to as an "EOS oscilloscope") is compared to a conventional sampling oscilloscope using an electrical probe, the following characteristics have received much attention:

1. It is easy to observe the signal because a ground wire is unnecessary.
2. Because the metal pin at the end of the electrooptic probe is not connected to the circuit system, it is possible to realize high input impedance, and as a result of this, there is almost no degradation of the state of the measured point.
3. By using an optical pulse, broadband measurement up to the GHz order is possible.

The structure of a probe for an EOS oscilloscope in the conventional technology will be explained using FIG. 7. In the electrooptic probe 1 shown in FIG. 7, a probe head 3 comprising an insulator is mounted on the end terminal of the metallic probe body 2, and a metallic pin 3a is fit into the center. Reference numeral 4 is an electrooptic element, a reflecting film 4a is provided on the end surface on the metallic pin 3a side, and is in contact with the metallic pin 3a. Reference numeral 5 is a ½ wavelength plate, and reference numeral 6 is a ¼ wavelength plate. Reference numeral 7 and 8 ate polarized beam splitters. Reference numeral 9 is a ½ wavelength plate, and reference numeral 10 is a Faraday element. Reference numeral 12 is a collimator lens, and reference numeral 13 is a laser diode. Reference numerals 14 and 15 are condensing lenses, and reference numerals 16 and 17 are photodiodes.

In addition, the two polarized beam splitters 7 and 8, the ½ wavelength plate 9, and the Faraday element 10 comprise an isolator 19 that transmits the light emitted by the laser diode 13, in order to split the light reflected by the reflecting film 4a.

Next, referring to FIG. 7, the optical path of the laser beam emitted from the laser diode 13 is explained. In FIG. 7, reference letter 'A' denotes the optical path of the laser beam.

First, the laser beam emitted from the laser diode 13 is converted by the collimator lens 12 into a parallel beam that travels straight through the polarized beam splitter 8, the Faraday element 10, the ½ wavelength plate 9, and the polarized light beam splitter 7, and then transits the ¼ wavelength plate 6 and the ½ wavelength plate 5, and is incident on the electrooptic element 4. The incident light is reflected by the reflecting film 4a formed on the end surface of the electrooptic element 4 on the side facing the metallic pin 3a.

The reflected laser beam transits the ½ wavelength plate 5 and the ¼ wavelength plate 6, one part of the laser beam is reflected by the polarized light beam splitter 7, condensed by the condensing lens 14, and incident on the photodiode 16. The laser beam that has transited the polarized light beam splitter 7 is reflected by the polarized beam splitter 8, condensed by the condensing lens 15, and incident on the photodiode 17.

Moreover, the angle of rotation of the ½ wavelength plate 5 and the ¼ wavelength plate 6 is adjusted so that the strength of the laser beam incident on the photodiode 16 and the photodiode 17 is uniform.

Next, using the electrooptic probe 1 shown in FIG. 7, the procedure for measuring the measured signal is explained. When the metallic pin 3a is placed in contact with the measurement point, due to the voltage applied to the metallic pin 3a, at the electrooptic element 4 this electrical field is propagated to the electrooptic element 4, and the phenomenon of the altering of the refractive index due to the Pockels effect occurs. Thereby, the laser beam emitted from the laser diode 13 is incident on the electrooptic element 4, and when the laser beam is propagated along the electrooptic element 4, the polarization state of the beam changes. Additionally, the laser beam having this changed polarization state is reflected by the reflecting film 4a, condensed and incident on the photodiode 16 and the photodiode 17, and converted into an electrical signal.

Along with the change in the voltage at the measurement point, the change in the state of polarization by the electrooptic element 4 becomes the output difference between the photodiode 16 and the photodiode 17, and by detecting this output difference, it is possible to observe the electrical signal applied to the metallic pin 3a.

Moreover, in the above-described electrooptic probe 1, the electrical signals obtained from the photodiodes 16 and 17 are input into an electrooptic sampling oscilloscope, and processed, but instead, it is possible to connect a conventional measuring device such as a real time oscilloscope at the photodiodes 16 and 17 via a dedicated controller. Thereby, it is possible to carry out simply broadband measurement by using the electrooptic probe 1.

In the manner described above, in the signal measurement using the electrooptic probe 1, because a metallic pin 3a must contact the measurement point, in this case, a shock is applied to the metallic pin 3a, and as a result, there is the concern that damage may occur to the electrooptic element 4.

In addition, the electrooptic probe 1 described above has a structure wherein a laser beam is incident on the reflecting film 4a, with which the metallic pin 3a is in contact, and is then reflected, and thus when the position of the metallic pin 3a is moved, the position of the reflecting film 4a, etc., shifts, and there is the problem that its function as an optical system is lost.

SUMMARY OF THE INVENTION

In consideration of the above described problems, it is an object of the present invention to solve this problem by improving the shock resistance of the electrooptic probe by anchoring the position of the metallic pin with respect to the probe head.

In order to solve the above problem, the following means are used.

A first aspect of the present invention is an electrooptic probe wherein:

a light path between a base terminal and an end terminal of the probe body is formed within the probe body;

at the end of the light path on the base terminal side of the probe body, a laser diode is disposed;

at the other end of the light path on the end terminal side of the probe body, an electrooptic element is disposed;

at the end surface of the electrooptic element on the end terminal side of the probe body, a reflecting film is formed;

the laser beam emitted from the laser diode is incident on the electrooptic element via the optical path, this incident beam is reflected by the reflecting film, and furthermore, this reflected light is separated and converted into an electric signal; and wherein the electrooptic element is supported at least from the end terminal side of the probe body by a probe head member that serves as the end terminal of the probe body;

an insertion hole from the outside to the reflecting film is formed on the probe head member;

the metallic pin is inserted in the insertion hole so that one end contacts the reflecting film and the other end projects from the probe head; and said insertion hole is formed so that the radial dimension of its outer side is large in comparison to the radial dimension of its reflection film side.

Because of this kind of construction, in this electrooptic probe, the one end of the metallic pin is formed so as to conform to the shape of the insertion hole, and thereby it is possible to prevent damage from occurring to the electrooptic element due to the metallic pin being inserted into the probe head member more than necessary.

A second aspect of the present invention is an electrooptic probe according to the first aspect wherein the photodiode and the laser diode are connected to an electrooptic sampling oscilloscope; and the laser diode generates a laser beam as a pulsed beam based on the control signal from the electrooptic oscilloscope.

A third aspect of the present invention is an electrooptic probe according to the second aspect wherein the insertion hole is formed having a tapered shape that gradually narrows from outside towards the reflection film side.

A fourth aspect of the present invention is an electrooptic probe according to the third aspect wherein the one end of the metallic pin is formed as a radially changing part such that the radial dimension becomes smaller from the one other end side to the one end side.

A fifth aspect of the present invention is an electrooptic probe according to the third aspect characterized in having a slit that passes through the metallic pin in the direction of the diameter being provided at the one end of the metallic pin.

Because of being structured in this manner, the one end of the metallic pin can be deformed so as to conform to the shape of the insertion hole provided in the probe head.

A sixth aspect of the present invention is an electric probe according to the second aspect characterized in the insertion hole being formed provided with steps on the inner surface, whose radial dimension becomes smaller from the outer side towards the reflecting film side.

A seventh aspect of the present invention an electrooptic probe according to the sixth aspect wherein the end of the metallic pin is formed as a radially changing part such that the radial dimension becomes smaller from the one end towards the other end.

A eighth aspect of the present invention is an electrooptic probe according to the sixth aspect characterized in having a slit that passes through the metallic pin in the direction of the diameter being provided at the one end of the metallic pin.

Because of being structured in this manner, in the electrooptic probe according to the eighth aspect, the one end of the metallic pin can be deformed so as to conform to the shape of the insertion hole provided on the probe head.

A ninth aspect of the present invention is an electrooptic probe according to the first aspect characterized in a laser diode generating a continuous laser beam.

In this manner, a continuous beam is generated from the laser diode, and thereby it is possible to obtain a continuous output from the photodiode, and therefor it is possible to make measurements by connecting a photodiode to a conventional general use measuring device such as a real time oscilloscope.

A tenth aspect of the present invention is an electrooptic probe according to the ninth aspect wherein the insertion hole is formed having a tapered shape that gradually narrows from the outside towards the reflection film side.

A eleventh aspect of the present invention is an electrooptic probe according to the tenth aspect wherein the one end of the metallic pin is formed as a radially changing part such that the radial dimension becomes smaller from the one end towards the other end.

A twelfth aspect of the present invention is an electrooptic probe according to the tenth aspect characterized in having a slit that passes through the metallic pin in the direction of the diameter being provided at the one end of the metallic pin.

Because of being structured in this manner, in the electrooptic probe according to the twelfth aspect, the one end of the metallic pin can be deformed so as to conform to the shape of the insertion hole provided on the probe head.

A thirteenth aspect of the present invention is an electric probe according to the ninth aspect characterized in the insertion hole being formed provided with steps on the inner surface whose radial dimension becomes smaller from the outside towards the reflecting film side.

A fourteenth aspect of the present invention is an electrooptic probe according to the thirteenth aspect wherein the end of the metallic pin is formed as a radially changing part such that the radial dimension becomes smaller from the one end towards the other end.

A fifteenth aspect of the present invention is an electrooptic probe according to the thirteenth aspect characterized in having a slit that passes through the metallic pin in the direction of the diameter being provided at the one end of the metallic pin.

Because of being structured in this manner, in the electrooptic probe according to the fifteenth aspect, the one end of the metallic pin can be deformed so as to conform to the shape of the insertion hole provided on the probe head.

A sixteenth aspect of the present invention is an electrooptic probe according to the first aspect characterized in the dimension of the one end of the insertion hole being larger than the spot size of the beam incident to the electrooptic element.

Because of being structured in this manner, in the electrooptic probe according to the sixteenth aspect, the contact surface area between he metallic pin and the reflecting film is ensured, and in the electrooptic element, the fluctuation in the electric field that appears as a fluctuation in the state of polarization can be favorably detected.

BRIEF DESCRIPTION OF THE DRAWINGS

FIG. 7 is a simplified diagram of the electrooptic probe showing the conventional technology of the present invention schematically.

Preferred Embodiments

Below an embodiment of the present invention will be explained referring to the figures.

Figure 2:
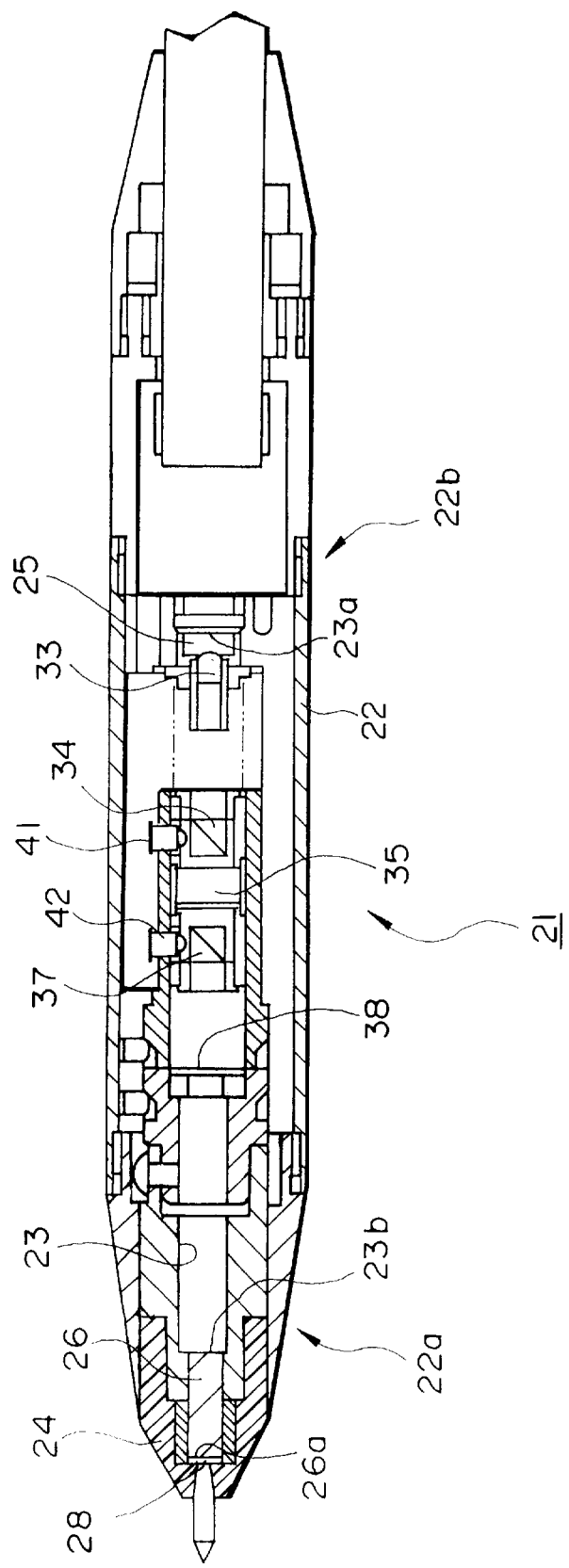
FIG. 2 is a drawing of a cross-section of the electrooptic probe shown in FIG. 1.
Figure 3:
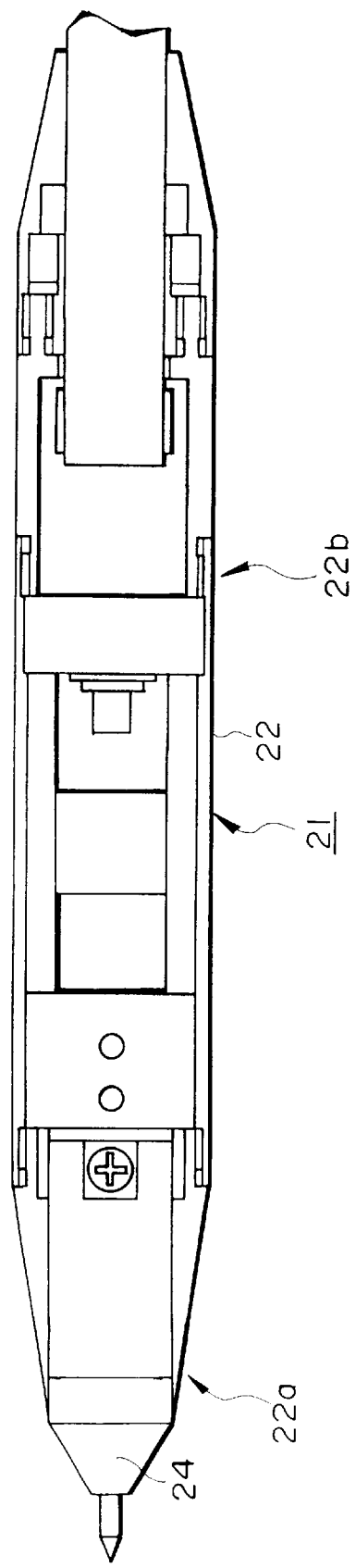
FIG. 3 is a planar drawing of the same.

FIG. 2 and FIG. 3 are respectively cross-sectional and planar drawings of the electrooptic probe 21 showing an embodiment of the present invention. This electrooptic probe 21 shows the schematic structure of an optical path 23 is formed inside the probe body.

The end terminal 22a of the probe body 22 is structured by the probe head member 24, and on the base terminal 22b of the probe body 22 a laser diode 25 is accommodated. The laser diode 25 is positioned at the one end 23a of the base terminal 22a side of the probe body 22 in the optical path 23, and connected to an EOS oscilloscope, omitted from the drawings.

In contrast, at the other end 23b on the end terminal 22a side of the probe body 22 in the optical path 23, an electrooptic element 26 is disposed. The electrooptic element 26 is supported by the probe head member 24, and at the end surface 26a of the electrooptic element 26 on the end terminal 22a side of the probe body 22, a reflecting film 28 is formed.

Figure 1:
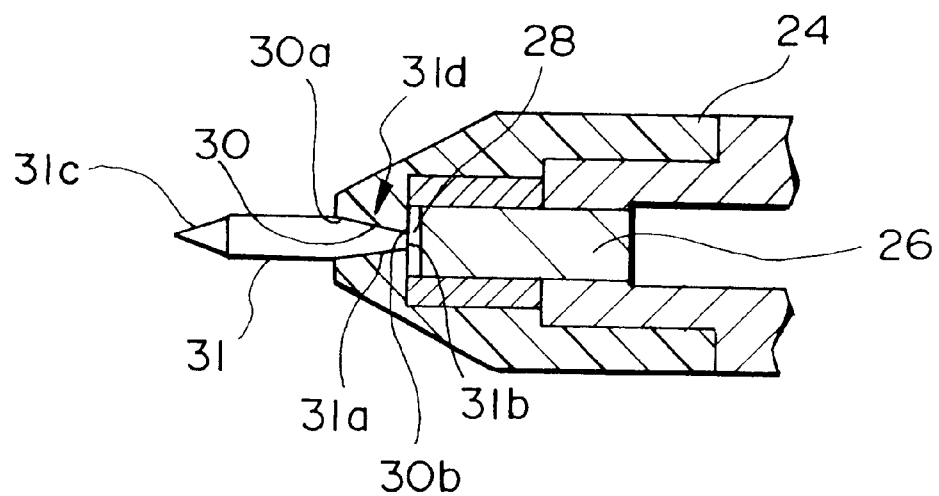
FIG. 1 is a drawing of an enlarged cross-section of the essential components of the electrooptic probe schematically showing the embodiment of the present invention.

FIG. 1 shows an enlargement of the probe head member 24 and its vicinity. As shown in the figure, in the probe head member 24, an insertion hole 30 is formed, and the one end 31 a of the metallic pin 31 is inserted therein. The metallic pin 31 is structured so that the end surface 31b of the one end 31a contacts the reflecting film 28 from the end terminal side of the probe body 22, and the other end 31c protrudes from probe head 24. Moreover, as a metallic pin 31, a phosphor bronze plated nickel rhodium can be used.

The shape of the insertion hole 30 tapers so that its radial dimension gradually decreases from the external end 30a towards the end 30b on the side of the reflecting film 28. Furthermore, on one end 31a of the metallic pin 31, a tapered part (radially changing part) is formed so that its radial dimension gradually decreases from the other end 31c side towards the end surface 31b. The radial dimensions of the tapered part 31d are formed so as to be slightly larger than the radial dimension of the insertion hole 30, and thereby, it becomes possible to insert and anchor the one end 31a of the metallic pin 31 into the insertion hole 30. In addition, the radial dimension of the terminal surface 31b of the metallic pin 31 is formed so as to be larger than the beam radius (the spot size of the incident beam) of the laser beam that is emitted from the laser diode 25 (refer to FIG. 2) and arrives at the reflecting surface 28 (refer to FIG. 2).

In contrast, as shown in FIG. 2, on the optical path 23, from the right in the figure, a collimator lens 33, a polarized beam splitter 34, a Faraday element 35, a polarized beam splitter 37, and a ¼ wavelength plate 38 are disposed. In addition, at the positions corresponding to the polarized beam splitters 34 and 37 on the side of the light path 23, photodiodes 41 and 42 are installed. These photodiodes 41 and 42 are connected to an EOS oscilloscope, convert the incident beam into an electrical signal, and can send it to the EOS oscilloscope.

In addition, the polarized beam splitters 34 and 37 can function as an isolator that separates a part of the light transiting the optical path 23, and makes it incident on photodiodes 41 and 42.

When the electrooptic probe 21 is used in signal measurement, the other end 31c of the metallic pin 31 is placed in contact with the measurement point, and the EOS oscilloscope is activated. Thereby, based on the control signal generated from the EOS oscilloscope, a laser beam is emitted from the laser diode 25, and this laser beam is converted into a parallel beam by the collimator lens 33, transits the optical path 23, and arrives at the electrooptic element 26.

The laser beam that has arrived at the electrooptic element 26 is incident on the reflecting film 28, is reflected, and progresses along the optical path 23 to the laser diode 25. At this time, because the refractive index of the electrooptic element 26 fluctuates due to the fluctuation in the electrical field of the measurement point propagated via the metallic pin 31, the polarization state of the light fluctuates when propagating through the electrooptic element 26, and the reflected light having the fluctuations polarization state is split by the polarized beam splitters 34 and 37, is focussed and incident on the photodiodes 41 and 42, and converted into an electrical signal. Thereby, the fluctuation in the polarization state of the laser beam is detected as the output difference of photodiodes 41 and 42, and it is possible to measure the electrical signal of the measurement point.

In the case of carrying out signal measurements in this manner, when the other end of the metallic pin 31 is in contact with the measurement point, even if it is mistakenly struck by the metallic pin 31, in this electrooptic probe 21, because the insertion hole 30 has a tapered form, and furthermore, the metallic pin 31 as well has a tapered part 31d corresponding to this shape, metallic pin 31 is inserted into the probe head member 24 only as far as is necessary, and there is no concern that the electrooptic element 26 will be damaged or that the position of the electrooptic probe 26 will shift, and thereby that the optical path formed in the probe body 22 will cease to function. Therefore, in this electrooptic probe 21, it is possible to ensure shock resistance during signal measurement.

Furthermore, in this electrooptic probe 21, because the radial dimension of the end 30b on the side of the reflecting film 28 of the insertion hole 30 is larger than the beam radius of the laser beam that is generated by the laser diode 25 and arrives at the reflecting film 28, it is possible to sufficiently ensure the amount of the contact surface area between the electrooptic element 26 and the metallic pin 31 for detecting the fluctuation of the polarization state of the electrooptic element 26. Therefore, even though the insertion hole 30 is formed with a taper, as described above, there is no decrease in the detection performance during signal measurement.

An example of the embodiment of the present invention has been explained above, but the present invention is not limited thereby, and is it possible to alter the shapes and materials without departing from the gist of the invention.

Figure 4A:
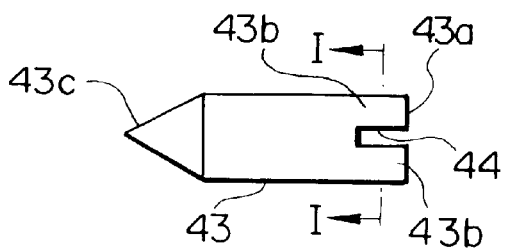
FIG. 4A is a side drawing showing another example of the metallic pin used in the electrooptic probe shown in FIG. 1 through FIG. 3.
Figure 4B:
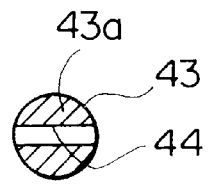
FIG. 4B is a perspective drawing along the arrow I-I.

For example, in place of the metallic pin 31 shown in the above embodiment, it is possible to use the metallic pin 43 as shown in FIG. 4A and FIG. 4B. The metallic pin 43 shown in FIG. 4A and FIG. 4B is structured providing a slit 44 that passes through one end 43a of the metallic pin 43 across the diameter.

By being structured in this manner, the one end 43a of the metallic pin 43 becomes compressible, and it is possible to be inserted easily in the tapered insertion hole 30 shown in the above-described embodiment. In this case, due to the repulsive force of the protruding parts 43b and 43b (refer to FIG. 4A) positioned on both sides of the slit 44, the one end 43a of the metallic pin 43 can be satisfactorily anchored in the insertion hole 30, and furthermore, in this case, even if a shock is applied from the other end 43c (refer to FIG. 4A) of the metallic pin 43, the metallic pin 43 is not inserted into the probe head member 24 any more than is necessary. Therefore, as shown in the above-described embodiment, it is possible to guarantee shock resistance. Moreover, when anchoring the metallic pin 43 formed in this manner in the insertion hole 30, it is preferable that the slit 44 be embedded with a conductive material, such as a silver paste, in order to eliminate any voids.

Figure 5:
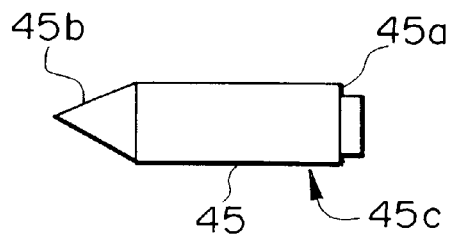
FIG. 5 is a side drawing showing a further example of the metallic pin.
Figure 6:
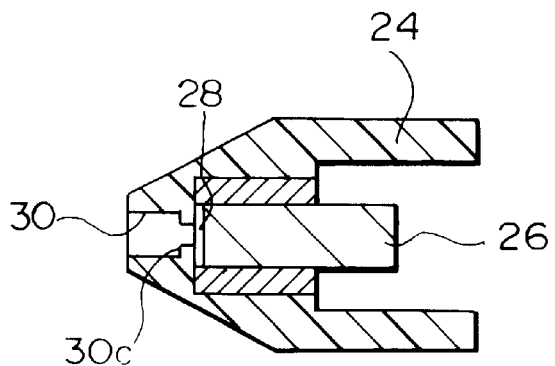
FIG. 6 is a cross-sectional drawing showing another example of the probe head.

In addition, it is also possible to obtain the same effect by using a metallic pin 45, shown in FIG. 5, provided with steps (radius changing part) 45c on the one end 45a whose radial dimension decreased from the other end 45b side towards the one end 45a side. Moreover, in this case, the shape of the insertion hole 30 into which the metallic pin 45 is inserted can have a tapered shape, such as that of the above-described embodiment. Or as shown in FIG. 6, it may also have steps 30c whose external radial dimension is large in comparison to the radial dimension of the reflecting film side.

Moreover, in the above-described embodiment, if a continuous beam is emitted from the laser diode 25, signal measurement by a conventional general measuring device such as a real time oscilloscope, a sampling oscilloscope, or a spectrographic analyzer is possible. In this case, on the photodiodes 41 and 42, in place of the EOS oscilloscope, via a dedicated controller, it is possible to connect the real time oscilloscope, sampling oscilloscope, or spectrographic analyzer.

What is claimed is:

1. An electronic probe comprising:
    a probe body having a base terminal and an end terminal wherein a light path is formed between the base terminal and the end terminal;
    a laser diode disposed at an end of the light path on a side of the base terminal;
    an electrooptic element disposed at a second end of the light path on a side of the end terminal;
    a reflecting film formed at an end surface of the electrooptic element on a side of the end terminal;
    the end terminal having a probe head member supporting the electrooptic element from at least a side of the end terminal;
    a metallic pin having an inserted part inserted in an insertion hole formed in the probe head member so that an end of the metallic pin contacts the reflecting film and a second end of the metallic pin projects from the probe head member;
    wherein a laser beam emitted from the laser diode is incident on the electrooptic element via the light path, an incident beam is reflected by the reflecting film, and a reflected light is separated and converted into an electric signal;
    the radial dimension of the insertion hole being larger at an outer side of the insertion hole than that at an inner side of the insertion hole;
    the inserted part of the metallic pin having a shape conforming to the shape of the insertion hole, and an inner surface of the insertion hole contacting an outer surface of the inserted part of the metallic pin in order to prevent the metallic pin from moving toward the reflecting film.

2. An electrooptic probe according to claim 1 wherein a photodiode and the laser diode are connected to an electrooptic sampling oscilloscope; and
    the laser diode generates a laser beam as a pulsed beam based on the control signal from the electroopic oscilloscope.

3. An electrooptic probe according to claim 1 wherein a photodiode and the laser diode are connected to an electrooptic sampling oscilloscope; and
    the laser diode generates a laser beam as a pulsed beam based on the control signal from the electrooptic oscilloscope.

4. An electrooptic probe according to claim 3 wherein the insertion hole is formed having a tapered shape that gradually narrows from an outside towards a reflection film side.

5. An electrooptic probe according to claim 4 wherein the one end of the metallic pin is formed as a radially changing part such that the radial dimension becomes smaller from the other end to the end of the metallic pin.

6. An electrooptic probe according to claim 4 wherein said pin has a slit at one end.

7. An electrooptic probe according to claim 3 wherein said insertion hole includes steps on the inner surface whose radial dimension decreases from an outside towards a reflection film side.

8. An electrooptic probe according to claim 7 wherein the end of the metallic pin is formed as a radially changing part such that the radial dimension becomes smaller from the one end towards the other end.

9. An electrooptic probe according to claim 7 wherein said pin has a slit at one end.

10. An electrooptic probe according to claim 1 wherein said laser diode generates a continuous laser beam.

11. An electrooptic probe according to claim 10 wherein the insertion hole is formed having a tapered shape that gradually narrows from an outside towards a reflection film side.

12. An electrooptic probe according to claim 11 wherein said pin has a slit at one end.

13. An electrooptic probe according to claim 10 wherein said insertion hole includes steps on the inner surface whose radial dimension decreases from an outside towards a reflection film side.

14. An electrooptic probe according to claim 13 wherein the end of the metallic pin is formed as a radially changing part such that the radial dimension becomes smaller from the one end towards the other end.

15. An electrooptic probe according to claim 13 wherein said pin has a slit at one end.

16. An electrooptic probe according to claim 1 wherein said dimension of the one end of the insertion hole is larger than a spot size of the beam incident to the electrooptic element.

* * * * *